United States Patent
Lindner

(10) Patent No.: US 9,653,329 B2
(45) Date of Patent: May 16, 2017

(54) SEMICONDUCTOR TREATING DEVICE AND METHOD

(71) Applicant: EV GROUP E. THALLNER GMBH, St. Florian am Inn (AT)

(72) Inventor: Friedrich Paul Lindner, Scharding (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 70 days.

(21) Appl. No.: 14/439,034

(22) PCT Filed: Nov. 19, 2013

(86) PCT No.: PCT/EP2013/074138
§ 371 (c)(1),
(2) Date: Apr. 28, 2015

(87) PCT Pub. No.: WO2014/076291
PCT Pub. Date: May 22, 2014

(65) Prior Publication Data
US 2015/0262849 A1 Sep. 17, 2015

(30) Foreign Application Priority Data
Nov. 19, 2012 (DE) .......................... 10 2012 111 114

(51) Int. Cl.
*H01L 21/67* (2006.01)
*G03F 1/64* (2012.01)
(Continued)

(52) U.S. Cl.
CPC ........ *H01L 21/67092* (2013.01); *B82Y 10/00* (2013.01); *B82Y 40/00* (2013.01);
(Continued)

(58) Field of Classification Search
None
See application file for complete search history.

(56) References Cited

U.S. PATENT DOCUMENTS

| 4,506,184 A | 3/1985 | Siddall .......................... 310/328 |
| 6,069,931 A | 5/2000 | Miyachi et al. ................ 378/34 |

(Continued)

FOREIGN PATENT DOCUMENTS

| JP | S57-205728 A | 12/1982 | ............. G03B 27/20 |
| JP | 2008-529826 A | 8/2008 | ............. B29C 59/02 |

(Continued)

OTHER PUBLICATIONS

Office Action issued in corresponding Korean Patent Application No. 10-2015-7008735 dated May 13, 2016.

(Continued)

*Primary Examiner* — Monica Huson
(74) *Attorney, Agent, or Firm* — Kusner & Jaffe

(57) ABSTRACT

A semiconductor processing device with bearing means for supporting a plate with one plate plane. The plate has a function region with evenness, a bearing region which surrounds the function region at least in sections, and an action region which is located outside the function region and outside the bearing region. The bearing means is made to support the plate in the bearing region and the action means is controllable such that by deformation of the function region the evenness can be adjusted and/or changed and/or influenced and/or re-set. The action means comprise at least one vacuum region which allows a deformation of the plate in the bearing region.

5 Claims, 2 Drawing Sheets

(51) Int. Cl.
  *G03F 7/00* (2006.01)
  *B82Y 10/00* (2011.01)
  *B82Y 40/00* (2011.01)
  *H01L 21/302* (2006.01)
  *H01L 21/52* (2006.01)

(52) U.S. Cl.
  CPC .............. *G03F 1/64* (2013.01); *G03F 7/0002* (2013.01); *H01L 21/302* (2013.01); *H01L 21/52* (2013.01)

(56) References Cited

U.S. PATENT DOCUMENTS

| | | | |
|---|---|---|---|
| 7,636,999 B2 | 12/2009 | Choi et al. | 29/559 |
| 8,215,946 B2 | 7/2012 | GanapathiSubramanian et al. | 425/400 |
| 2003/0081193 A1 | 5/2003 | White et al. | 355/72 |
| 2003/0197841 A1 | 10/2003 | Araki et al. | 355/50 |
| 2006/0172031 A1 | 8/2006 | Babbs et al. | 425/385 |
| 2006/0172553 A1 | 8/2006 | Choi et al. | 438/780 |
| 2007/0024831 A1 | 2/2007 | Hibbs et al. | 355/53 |
| 2007/0264582 A1 | 11/2007 | Chang et al. | 430/5 |
| 2008/0013068 A1 | 1/2008 | Jeunink et al. | 355/75 |
| 2010/0072652 A1 | 3/2010 | Ganapathisubramanian et al. | 264/101 |
| 2010/0209826 A1 | 8/2010 | Kim et al. | 430/5 |

FOREIGN PATENT DOCUMENTS

| | | | | |
|---|---|---|---|---|
| JP | 2008-251944 A | 10/2008 | | G03F 7/20 |
| JP | 2010-002571 A | 1/2010 | | G03F 7/20 |
| JP | 2010-251379 A | 11/2010 | | H01L 21/027 |
| JP | 2012-507138 A | 3/2012 | | B29C 59/02 |
| KR | 2008-0085291 A | 9/2008 | | H01L 21/027 |

OTHER PUBLICATIONS

Japanese Office Action issued in corresponding Japanese Patent Application No. 2015-542292 dated Jun. 13, 2016.
Search Report issued in corresponding International Patent Application No. PCT/EP2013/074138, dated Apr. 24, 2014.
Google Translate, "Ebenheit," website printout from https://translate.google.com/?hl=en&tab=tT#de/en/Ebenheit.
"Specification for Hard Surface Photomask Substrates," SEMI P1-0708$^E$, Audits and Reviews Subcommittee, pp. 1-10, May 13, 2008.

FIG. 1a
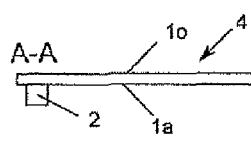
FIG. 1b
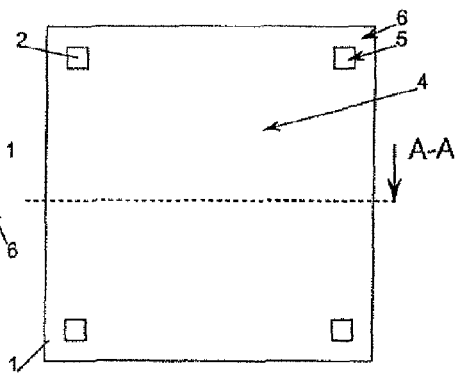
FIG. 2a
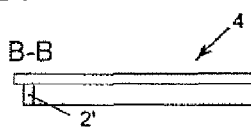
FIG. 2b
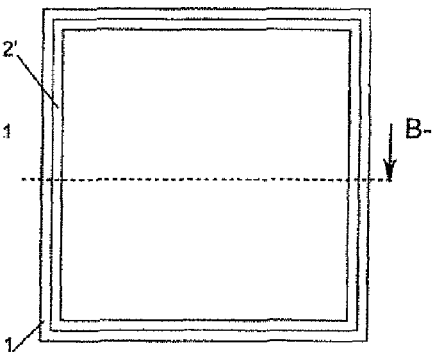
Fig. 3a
Fig. 3b
FIG. 3a
FIG. 3b
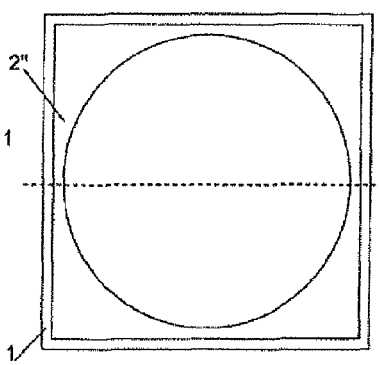

SEMICONDUCTOR TREATING DEVICE AND METHOD

RELATED APPLICATIONS

This application is a National Stage of International Application No. PCT/EP2013/074138 filed Nov. 19, 2013, which claims the benefit of German Patent Application No. DE 102012111114.6, filed Nov. 19, 2012.

FIELD OF THE INVENTION

This invention relates to a semiconductor processing device with bearing means for supporting a plate and a semiconductor processing method.

BACKGROUND OF THE INVENTION

In the semiconductor industry, different physical and/or chemical methods are known. Using such methods, structures in the microrange and/or nanorange can be produced quickly, efficiently and economically. One of the most frequently used methods is lithography. Lithography is defined as the transfer of a structure into another material.

The best-known lithography method is photolithography. In a photolithographic process, a geometrically correspondingly broad light beam of narrow band (in terms of frequency) is used to illuminate a structured mask in a blanket manner. The mask consists of a base material which is transparent to the wavelength of the light used. On at least one of the two opposing surfaces, there is a thin layer structure of a material which is opaque to the wavelength of the light used, which structure has been produced by vapor deposition processes. The opaque elements of the thin layer structure prevent the passage of the photons at the corresponding site. The transparent locations which are not covered by the opaque thin layer structure allow unhindered passage of the photons. In this way, the imaging of the transparent regions of the mask onto any surface is enabled. In the most frequent embodiment, this method is used to image the transparent regions into a polymer which reacts sensitively to the photons of corresponding wavelength and causes a chemical reaction by irradiation. By other processes, a corresponding positive or negative of the mask can be produced in the polymer layer, and the mask is used for further process steps as a corresponding polymer mask on the substrate.

Another lithography method is embossing. In this method, a structure on the surface of a punch is used to leave a corresponding negative in an embossing material. The embossing material is cured before the removal of the punch from the mold. The number of required process steps for producing a corresponding structure can be somewhat smaller than for photolithographic processes.

The technology of structure transfer is becoming more and more complicated as structures become smaller and smaller. The reason for this is mainly the action of macroscopic inhomogeneities on microscopic elements. For example, any ordinary plate which rests on at least three bearings in a gravitational field will have bending which can be negligible for many macroscopic applications. But if the intention is to image nanometer-sized and/or micrometer-sized structures which are located on a mask by the afore-mentioned photolithography processes in a blanket, complete and exact manner, it is recognized that the sag of the mask for such small structures can no longer be ignored. With reference to photolithography masks, the problem is exacerbated by the structures having to be smaller and smaller and the diameters of the masks larger and larger. The reduction in the size of the structures on the mask is the result of the afore-mentioned miniaturization in the field. The increase of the mask diameter is necessary since the exposed polymer layers are applied to larger and larger wafers in order to increase the throughput of the functional units which are to be produced, for example microchips, MEMS, etc. At the same time, the masks should become thinner and thinner in order to allow as much light as possible through the transparent regions of the mask in order to increase the intensity.

Similar considerations exist with reference to the punch for embossing lithography.

An advantage of this invention is a semiconductor processing device and a semiconductor processing method, wherein exact structures can be reproducibly manufactured even for large areas.

This advantage is achieved with the feature of the independent claims. Advantageous developments of the invention are given in the dependent claims. All combinations of at least two of the features given in the specification, the claims and/or in the figures fall within the scope of the invention. For given values ranges, values which lie within the indicated limits should be considered disclosed as boundary values and able to be claimed in any combination.

SUMMARY OF THE INVENTION

The invention is based on the concept of arranging bearing means for supporting a plate with a function region and action means such that a deformation of the function region of the plate can be controlled in a dedicated manner by the action means, i.e., can be adjusted and/or changed and/or influenced and/or re-set. The bearing means are used to support the plate, solely in a bearing region which surrounds the function region at least in sections. The action region of the plate is located in particular outside the function region and/or outside the bearing region.

The action means are dimensioned to compensate for asymmetries and/or distortions of a plate by application of a force, predominantly by a normal tension in the action region, preferably in one edge region or on the periphery of the plate. In particular, bending lines or curvatures present in the cross section of the plate can be compensated by the action means so that the evenness of the plate, especially in the function region, is improved.

According to the invention, a "function region" is defined as a region of the plate which is intended for the transfer of the structures, such as a mask region of a photolithography mask or a region of a punch which has structures.

To the extent the plate is a mask, such as a photolithography mask, the improved evenness of the mask in the function region yields imaging with a structure as free of faults as possible since the evenness of the mask can be optimized with the action means. Possible distortions or bendings of the mask in the function region can be compensated. In particular, as diameters of the mask become larger and larger, because of the lack of support in the center of the mask, i.e., in the function region, sagging of the mask occurs, even if only minor; this leads to imaging faults. According to the invention, a normal tension is applied in a controlled manner in the action region or on the periphery of the mask outside the bearing region in order to counteract the deformation of the mask in the function region.

According to another advantageous embodiment of the invention, the function region and/or the bearing region and/or the action region are arranged symmetrically to the center of the plate. Since the distortion and/or bendings of the function region are also located or run symmetrically, compensation can be achieved optimally in this way with few complex action means. Moreover, the computation and control of the compensation by the action means are easier due to the symmetrical arrangement.

It is especially advantageous if the action means are made to act at a point, i.e., separately controllable. Certain regions of the mask can be deformed in a controlled manner by spot action, on the periphery.

The method as claimed in the invention is comprised by the following steps:

supporting a plate by bearing means in one bearing region of the plate, optionally fixing the plate by the bearing means, at least with respect to the degrees of freedom parallel to the plane of the plate, optionally measuring and/or computing the evenness of the plate in one function region of the plate, acting on the plate in the action region such that the function region is deformed.

Features disclosed according to the device will also be considered disclosed according to the method. Other advantages, features and details of the invention will become apparent from the following description of preferred exemplary embodiments using the drawings.

BRIEF DESCRIPTION OF THE DRAWINGS

FIG. 1a shows a cross sectional view of a first embodiment of the invention according to cutting line A-A from FIG. 1b, FIB. 1b shows a schematic view of the first embodiment from underneath, FIG. 2a shows a cross sectional view of a second embodiment of the invention according to cutting line B-B from FIG. 2b, FIG. 2b shows a schematic view of the second embodiment from underneath, FIG. 3a shows a cross sectional view of a third embodiment of the invention according to cutting line C-C from FIG. 3b, FIG. 3b shows a schematic view of the third embodiment from underneath.

The same features or features with the same action are identified with the same reference numbers.

DETAILED DESCRIPTION OF THE PREFERRED EMBODIMENTS

Figure 4:
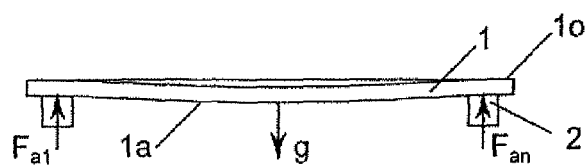
FIG. 4 shows a schematic of the forces acting as claimed in the invention.

The invention describes a method and an apparatus with which a preferably rectangular plate 1 that is supported with one support side 1a in a bearing region 5 on bearings 2, 2', 2" can be stressed by any number of force actions such that its distortion state can be actively changed.

The bearings 2, 2', 2" which are made as supports can be fixed and/or floating bearings. The forces F1, . . . ,Fn (hereinafter labeled Fn) can be set on the support side 1a or the top 1o opposite the support side 1a by action means which act in one action region 6, especially separately path-controlled and/or force-controlled compression and/or pulling elements 3 (first group of embodiments as claimed in the invention according to FIGS. 1 to 6), preferably actuators, or fluid paths 7 (second group of embodiments as claimed in the invention according to FIGS. 7 and 8). Preferably, the forces Fn act on the side 1o of the plate 1, as forces Fn which produce a normal tension. Preferably, the forces Fn act only on the outermost periphery of the plate 1.

The control takes place by a software-supported control apparatus, which is not shown and which also undertakes triggering of the other elements of the device, and functions of the described method.

Figure 5:
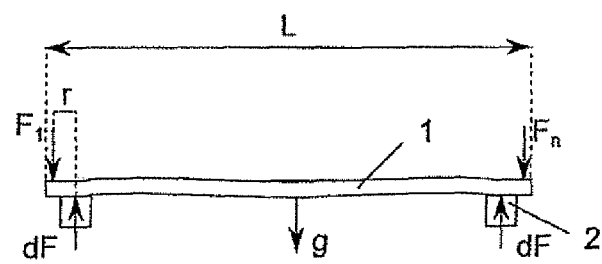
FIG. 5 shows a schematic of the action forces acting as claimed in the invention.

If the plate 1 is located in a gravitational field g, the gravitational field can cause sagging of the plate 1 (FIG. 4). The support forces Fa1 . . . Fan can be computed according to the fundamental laws of statics. For the sake of simplicity, FIGS. 4 and 5 show the cross section of the embodiment of FIG. 1 in which the plate 1 lies on four bearings 2. It is clear to one skilled in the art in the field that the bearings 2 can also have any other shape, such as the ones shown in FIGS. 2a, 2b and 3a, 3b. Then, the support forces Fa1 . . . Fan or the support force distribution could be computed accordingly.

The sag caused by the force of gravity g in FIG. 4 can be compensated by the application of the force F1 . . . Fn. The inventive concept is comprised in changing the general global elongation state of the plate 1 based on the given statics of the plate 1 and the bearing means (bearings 2, 2', 2") which support the plate 1. Here the unevenness inherent in the plate 1 can also be taken into account by the structure of the plate 1 being measured, particularly on its function region 4 which is located within the bearing means.

The functional region 4 is an active (transilluminated) mask region of the plate 1 which is made as a photolithography mask in one preferred embodiment of the invention.

Figure 6:
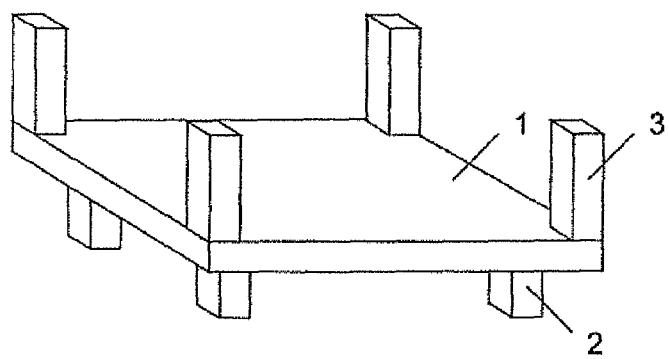
FIG. 6 shows a schematic perspective view of the first embodiment with action means as claimed in the invention.

The most general embodiment of an apparatus is shown in FIG. 6. Several compression and/or pulling elements 3 preferably act on the periphery of the plate 1 which is supported on bearings 2. The compression and/or pulling elements 3 and the bearings 2 can be located on the same side. This would enable mainly the use of one free-standing function side. Only a single, round compression and/or pulling element 3 which would be used for a round outside contour of the plate 1 is also possible.

According to the invention, there are more than two compression and/or pulling elements 3, preferably more than five, more preferably more than ten, most preferably more than 20 in the action region 6, distributed on the periphery. The controllable force F1 . . . Fn of each compression and/or pulling element 3 which acts on the plate 1 is between 0 and 100000 N, preferably between 0 and 10000 N, more preferably between 0 and 1000 N, most preferably between 0 and 100 N, most preferably of all between 0 and 10 N.

In particular, one lever arm r (best seen in FIG. 5) between the support forces Fa1 . . . Fan and the forces F1 . . . Fn is as large as possible in order to increase the sensitivity of the device. The lever arm r is greater than 1 mm, preferably greater than 5 mm, more preferably greater than 10 mm, still more preferably greater than 20 mm, most preferably greater than 40 mm, most preferably of all greater than 60 mm. The ratio between the average length L of the plate and the lever arm r is greater than 1/10000, preferably greater than 1/1000, more preferably greater than 1/100, most preferably greater than 1/10.

Figure 7:
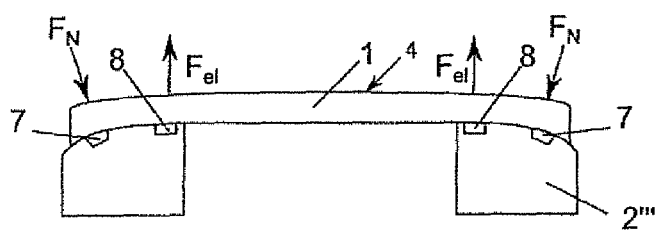
FIG. 7 shows a schematic view of one embodiment with a special bearing and action means as claimed in the invention and FIG. 8 shows a schematic view of one embodiment with a special bearing and action means as claimed in the invention.

In one special embodiment according to FIG. 7, a support 2''' has at least one, preferably several fluid paths 7, 8 which are located on the periphery of the plate 1. The fluid path 7 is a vacuum path which fixes the plate 1 onto the support 2''' via the differential pressure which is formed by suction. The differential pressure which is integrated over the area yields the force which is acting on the area section and which is shown in FIG. 7 by $F_N$. At the same time, by producing an overpressure in the fluid path 8 a force $F_{el}$ directed to the outside can arise which contributes to the active compensation of the plate 1.

The fluid path 8 can be omitted when additional application of force is not desired, not possible, or not allowed.

It is clear to one skilled in the art in the field that the disclosed compression and/or pulling elements which are intended to deform the plate according to the laws of elasticity theory can also be replaced by simple retaining elements. The retaining elements would then be designed such that they are used to statically fix the plate 1, therefore as fixed bearings. By skillful selection and/or positioning of the retaining elements, a corresponding plate 1 can always be shifted into the necessary distortion and/or strain state. The disadvantage of this static fixing is the more difficult replaceability of corresponding plates 1.

The shape of the supports 2''' on the contact surface to the plate 1 contributes to the distortion state and/or strain state of the plate 1, especially in its function region. As shown in FIG. 7, because the support 2''' drops (i.e., slopes) toward the outside, the vacuum paths 7 force the plate 1 around this curvature, and the outer edge of the plate 1 is shifted into a corresponding distortion state which has stabilizing and/or deforming effects on the function region 4. Corresponding supports can be computed by means of finite element methods and corresponding software.

Preferably, the plate 1 in FIG. 7 is a photolithography mask which is located on the support 2'''.

A rotation of FIG. 7 by 180° discloses a plate 1 which can be used as a punch for a microimprint process and/or nanoimprint process.

The support 2''' can be shaped according to the deformation to be achieved, i.e., also concavely when viewed from above.

Figure 8:
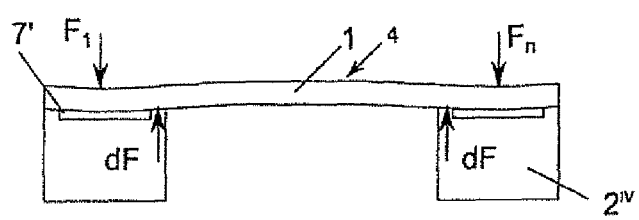

A support can be for example completely even, as shown in FIG. 8. This embodiment of the bearings $2^{IV}$ can be produced much more simply. The vacuum regions 7 allow a local sag of the plate 1 in the support region and thus lead to a corresponding correction of the distortions of the plate 1.

Preferably the plate 1 in FIG. 8 is a photolithography mask which is located on the support $2^{IV}$.

A rotation of FIG. 7 or FIG. 8 by 180° discloses a plate 1 which can be used as a punch for a microimprint process and/or nanoimprint process.

The reliable suction of the plate 1 by the vacuum paths 7, 7' can be ensured by corresponding mechanical elements such as sealing lips.

The method as claimed in the invention and embodiments can compensate, even eliminate or at least for the most part equalize not only the gravitation-induced sag of the plate 1, but also any type of "intrinsic" deviation from planarity/evenness which is already inherent in the plate.

The statements on the first group of embodiments according to FIGS. 1 to 6 apply analogously to the second group, if nothing different results above or from the figures.

REFERENCE NUMBER LIST 1 plate
1a support side
1o top
2, 2', 2'', 2''', $2^{IV}$ bearing means
3 compression and/or pulling elements
4 function region
5 bearing region
6 action region
7 vacuum path
9 pressure path
r lever arm
F1 . . . Fn forces
Fa1 . . . Fan support forces
$F_{el}$ force
L average length of the plate Having described the invention, the following is claimed:

1. A semiconductor processing device, comprising:
a plate having a plate plane which has a function region with an evenness, and a bearing region which surrounds the function region at least in sections;
bearing means dimensioned to support the plate in the bearing region; and
an action means for modifying the evenness of the function region by controllable deformation of the function region,
wherein the action means comprise at least one vacuum region which allows a deformation of the plate in the bearing region,
wherein the action means are suited to compensate for asymmetries and/or distortions of the plate predominantly by a normal tension in an action region, and
wherein the action means and bearing means are located on the same side.

2. The semiconductor processing device as claimed in claim 1, wherein the plate is photolithography mask.

3. The semiconductor processing device as claimed in claim 1, wherein the function region and/or the bearing region and/or the action region are arranged symmetrically to the center of the plate.

4. The semiconductor processing device as claimed in claim 3, wherein the action means can act on the function region with a torque via a pivotal point which is formed by the bearing means.

5. A semiconductor processing method, comprising:
providing a plate with a plate plane which has a function region with an evenness, and supporting said plate; and
a bearing region which surrounds the function region at least in sections; and
applying a vacuum to the plate in a vacuum region that is located outside the function region, such that the function region is deformed by deformation of the plate in the bearing region.

* * * * *